(12) United States Patent
Zeng et al.

(10) Patent No.: US 12,593,718 B2
(45) Date of Patent: Mar. 31, 2026

(54) MEMORY SYSTEM PACKAGE STRUCTURE AND MANUFACTURING METHOD THEREOF

(71) Applicant: Yangtze Memory Technologies Co., Ltd., Hubei (CN)

(72) Inventors: Xinru Zeng, Hubei (CN); Zhen Xu, Hubei (CN); Weisong Qian, Hubei (CN); Peng Chen, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 546 days.

(21) Appl. No.: 18/090,608

(22) Filed: Dec. 29, 2022

(65) Prior Publication Data

US 2024/0178089 A1 May 30, 2024

Related U.S. Application Data

(63) Continuation of application No. PCT/CN2022/134200, filed on Nov. 24, 2022.

(51) Int. Cl.
| | |
|---|---|
| *H01L 23/48* | (2006.01) |
| *H01L 23/00* | (2006.01) |
| *H01L 23/31* | (2006.01) |
| *H01L 23/498* | (2006.01) |
| *H01L 23/52* | (2006.01) |
| *H01L 23/552* | (2006.01) |
| *H10B 80/00* | (2023.01) |

(52) U.S. Cl.
CPC .... *H01L 23/3128* (2013.01); *H01L 23/49827* (2013.01); *H01L 23/552* (2013.01);
(Continued)

(58) Field of Classification Search
CPC ........... H01L 23/3128; H01L 23/49827; H01L 23/552; H01L 24/85; H01L 24/92;
(Continued)

(56) References Cited

U.S. PATENT DOCUMENTS

| | | | |
|---|---|---|---|
| 11,538,746 B2 | 12/2022 | Ding et al. | |
| 2016/0049385 A1* | 2/2016 | Yu | H01L 23/481 |
| | | | 257/774 |
| 2017/0084589 A1* | 3/2017 | Kuo | H01L 23/3128 |

FOREIGN PATENT DOCUMENTS

| | | |
|---|---|---|
| CN | 107731770 A | 2/2018 |
| CN | 110050340 A | 7/2019 |
(Continued)

OTHER PUBLICATIONS

Korean Office Action issued on Jul. 18, 2024 in the corresponding Korean Patent Application No. 10-2023-7020862 (with English Summary) 10 pages.

(Continued)

*Primary Examiner* — Theresa T Doan
(74) *Attorney, Agent, or Firm* — Oblon, McClelland, Maier & Neustadt, L.L.P.

(57) ABSTRACT

A memory system package structure and a manufacturing method thereof are disclosed. For example, the memory system package structure can include a memory chip, a memory controller and a distribution layer. The memory chip can include a first surface. The memory controller can be positioned on the first surface. The redistribution layer can be positioned on a side of the memory controller facing away from the memory chip. The memory chip and the memory controller can be electrically connected with the redistribution layer.

15 Claims, 5 Drawing Sheets

(52) U.S. Cl.
CPC .............. *H01L 24/85* (2013.01); *H01L 24/92*
(2013.01); *H10B 80/00* (2023.02); *H01L*
*2924/1434* (2013.01)

(58) Field of Classification Search
CPC ........... H01L 2924/1434; H01L 23/293; H01L
23/49816; H01L 25/18; H01L 25/50;
H01L 2224/02381; H10B 80/00
USPC ......................................................... 257/738
See application file for complete search history.

(56)                    References Cited

FOREIGN PATENT DOCUMENTS

| | | | |
|---|---|---|---|
| CN | 112956023 | A | 6/2021 |
| KR | 10-1519307 | B1 | 5/2015 |
| KR | 10-2016-0051656 | A | 5/2016 |
| KR | 10-2020-0037051 | A | 4/2020 |
| TW | 202115837 | A | 4/2021 |
| TW | 202238907 | A | 10/2022 |

OTHER PUBLICATIONS

Combined Taiwanese Office Action and Search Report issued on
May 31, 2024 in the Taiwanese Patent Application No. 112124821
(with Translation of Category of Cited Documents) 12 pages.
Combined Chinese Office Action and Search Report issued on
March 3, 2023 in the international Application No. PCT/CN2022/
134200 (with Translation of Category of Cited Documents) 4 pages

* cited by examiner

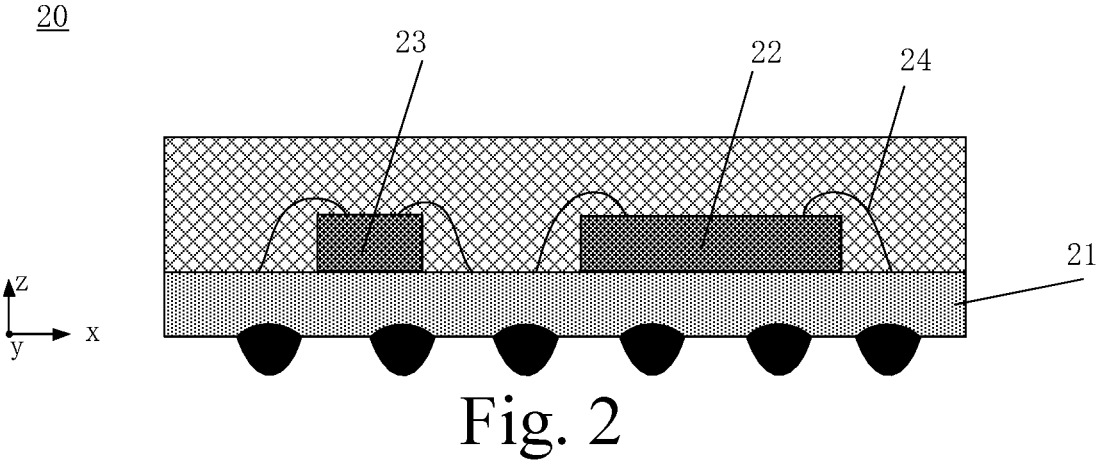

Fig. 2

| Providing a memory chip, the memory chip including a first surface and a second surface which are oppositely disposed, and the second surface being stacked on a carrier | S101 |
| --- | --- |
| Stacking a memory controller on the first surface | S102 |
| Removing the carrier and exposing the second surface | S103 |
| Forming a redistribution layer on a side of the memory controller facing away from the memory chip, the memory chip and the memory controller being electrically connected with the redistribution layer, respectively | S104 |

Fig. 3

MEMORY SYSTEM PACKAGE STRUCTURE AND MANUFACTURING METHOD THEREOF

CROSS-REFERENCE TO RELATED APPLICATIONS

This present disclosure is a continuation of International Application No. PCT/CN2022/134200 filed on Nov. 24, 2022, which is incorporated herein by reference in its entirety.

TECHNICAL FIELD

The present disclosure relates to the technical field of semiconductor, and in particular, to a memory system package structure and a manufacturing method thereof.

BACKGROUND

A memory system mainly includes a memory chip and a memory controller. The packaging of the memory system is mainly to electrically connect the memory chip and the memory controller, and then wrap them up with a housing, so as to ensure the normal operation of the memory chip and the memory controller while protecting them.

However, the overall size of a package structure obtained by the existing packaging technology has increased by at least 30% compared with the size of the memory chip itself, which seriously restricts the development of the packaging technology of the memory system.

SUMMARY

The present disclosure provides a memory system package structure and a manufacturing method thereof, which can reduce an overall size of the package structure.

In an aspect, an implementation of the present disclosure provides a memory system package structure. For example, the memory system package structure can include:

a memory chip, including a first surface;

a memory controller, positioned on the first surface; and a redistribution layer, positioned on a side of the memory controller facing away from the memory chip, the memory chip and the memory controller being electrically connected with the redistribution layer.

In another aspect, an implementation of the present disclosure further provides a manufacturing method of a memory system package structure. For example, the manufacturing method can include:

providing a memory chip, the memory chip including a first surface and a second surface which are oppositely disposed, the second surface being stacked on a carrier;

stacking a memory controller on the first surface;

removing the carrier and exposing the second surface; and forming a redistribution layer on a side of the memory controller facing away from the memory chip, the memory chip and the memory controller being electrically connected with the redistribution layer.

BRIEF DESCRIPTION OF THE DRAWINGS

In order to more clearly illustrate the technical solutions in the implementations of the present disclosure, the accompanying drawings used in the description of the implementations will be briefly described below. Obviously, the accompanying drawings in the following description only illustrate some of the implementations of the present disclosure. For those skilled in the art, other drawings can be obtained according to these drawings without any creative effort.

FIGS. 1g' to 1i' are another set of schematic cross-sectional views of the memory system package structure in different process steps provided by an implementation of the present disclosure;

FIG. 2 is a schematic cross-sectional view of another exemplary memory system package structure provided by an implementation of the present disclosure; and FIG. 3 is a flowchart of an exemplary manufacturing method of a memory system package structure provided by an implementation of the present disclosure.

DETAILED DESCRIPTION

Figure 1A:
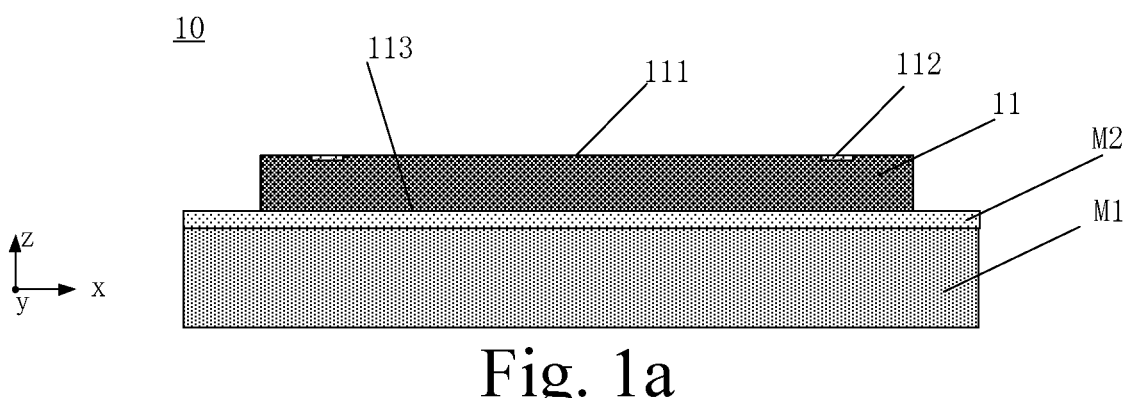
FIGS. 1a to 1i are schematic cross-sectional views of an exemplary memory system package structure in different process steps provided by an implementation of the present disclosure.

The present disclosure is described in further detail below with reference to the drawings and implementations. In particular, the following implementations are merely illustrative of the present disclosure, and are not intended to limit the scope of the present disclosure. Likewise, the following implementations are only some but not all of the implementations of the present disclosure, all other implementations obtained by those skilled in the art without creative efforts shall fall within the scope of the present disclosure.

In the description of the present disclosure, it should be understood that, orientations or positional relationships indicated by terms such as "central", "lateral", "upper", "lower", "left", "right", "vertical", "horizontal", "top", "bottom", "inner", "outer", and the like should be construed to refer to the orientations or positional relationships as shown in the drawings. These terms are intended only to facilitate the description of the disclosure and to simplify the description, and do not indicate or imply that the devices or elements referred to should have a particular orientation, or be constructed and operated in a specific orientation, and therefore cannot be construed to limit the present disclosure. In addition, terms such as "first" and "second" are used herein only for purposes of description and are not intended to indicate or imply relative importance or significance or to imply the number of indicated technical features. Thus, the feature defined with "first" and "second" may explicitly or implicitly includes one or more of the features.

In the description, unless specified or limited otherwise, the terms "mounted", "connected", "coupled" and the like should be construed in a broad sense, and may be, for example, fixed connections, detachable connections, or integral connections; may also be mechanical connections, or electric connections; may also be direct connections, or indirect connections via an intervening medium; may also be inner communications of two elements. The specific meaning of the above terms within the present disclosure may be understood by those skilled in the art according to particular circumstances.

It is to be understood that the meanings of "on", "above" and "on top of" in the description herein should be interpreted in the broadest manner, so that "on" not only means that it is "on" something without intervening features or layers (i.e., directly on something), but also that it is "on" something with intervening features or layers.

The terms used here are only for the purpose of describing specific implementations and are not intended to limit the exemplary implementations. Unless the context clearly indicates otherwise, the singular forms of "a" and "an" used here are also intended to include the plural forms. "Multiple" means two or more. It should also be understood that the terms "include" and/or "comprise" used here specify the presence of stated features, integers, steps, operations, units and/or components, but do not exclude the presence or addition of one or more other features, integers, steps, operations, units, components and/or combinations thereof.

The implementations of the present disclosure provide a memory system package structure and a manufacturing method thereof.

Figure 1B:
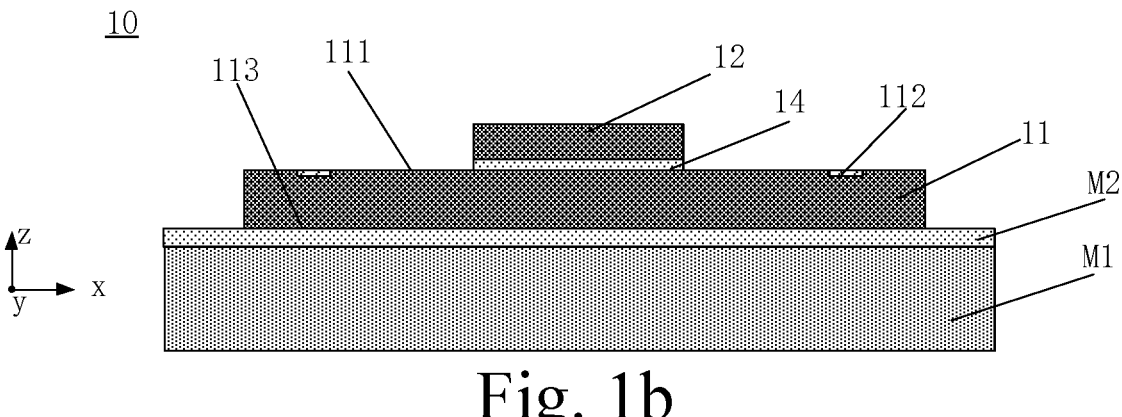
Figure 1C:
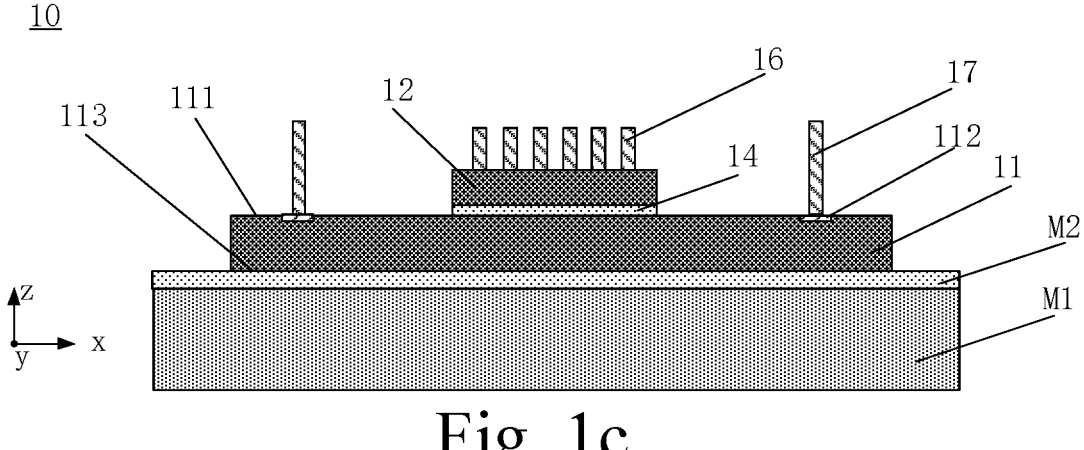
Figure 1D:
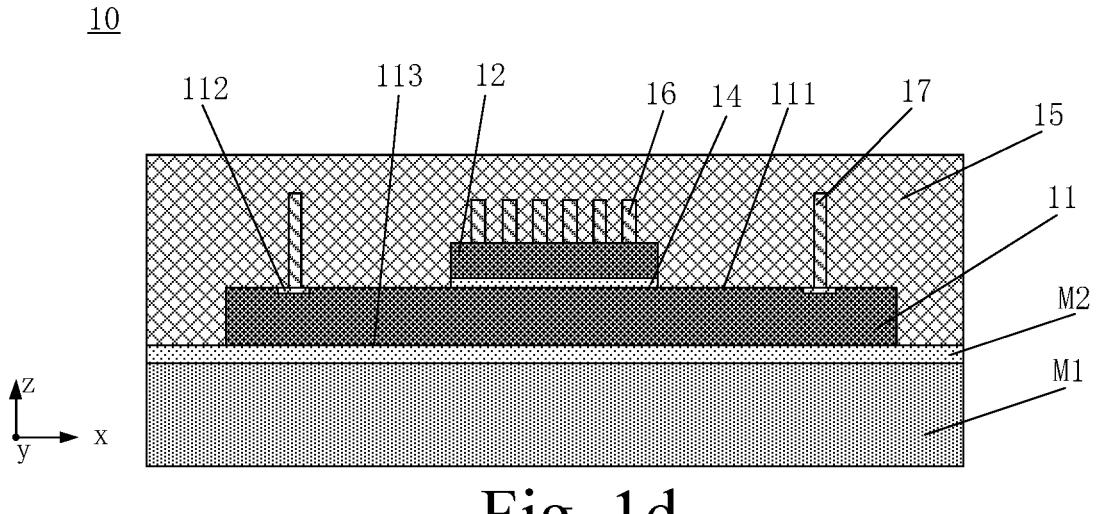
Figure 1E:
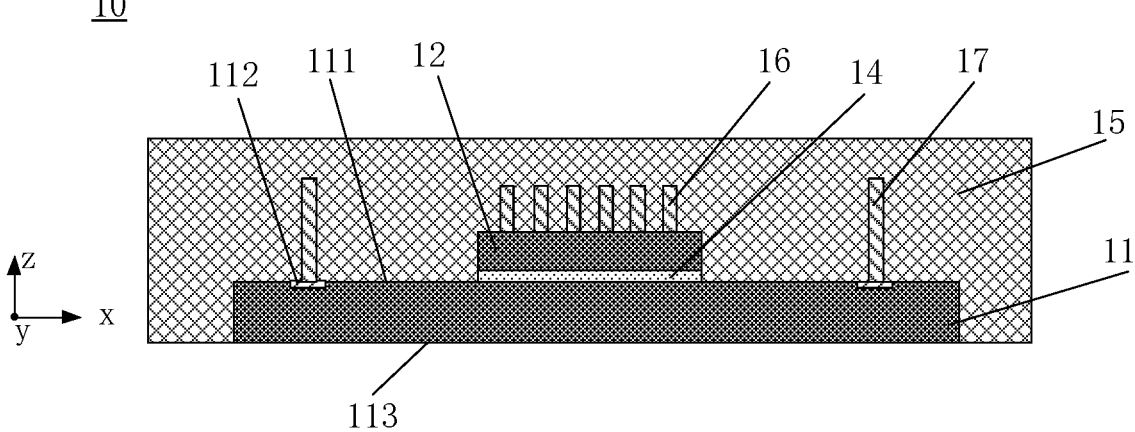
Figure 1F:
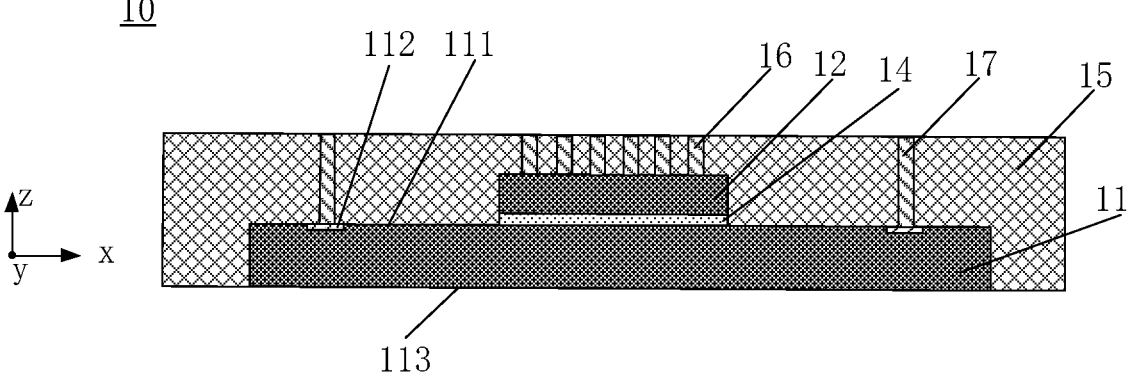
Figure 1G:
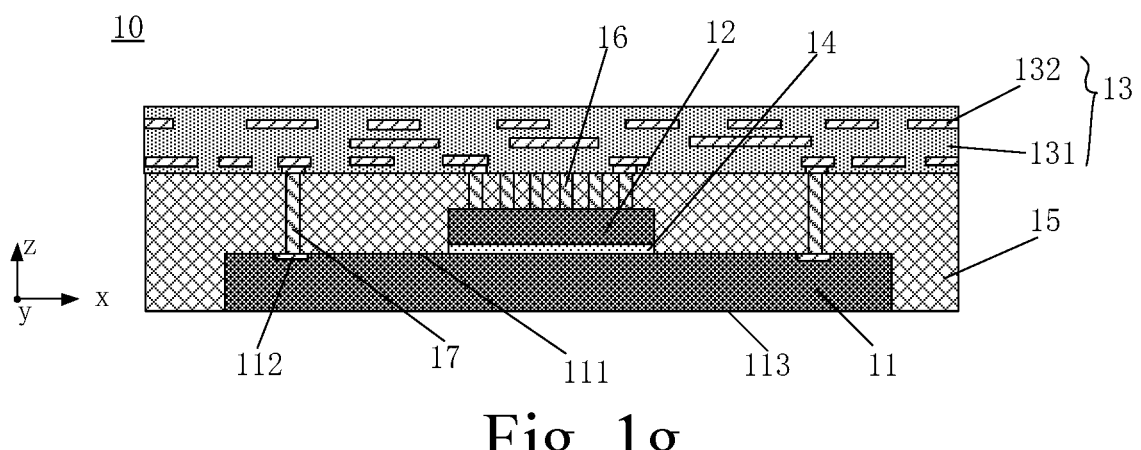
Figure 1H:
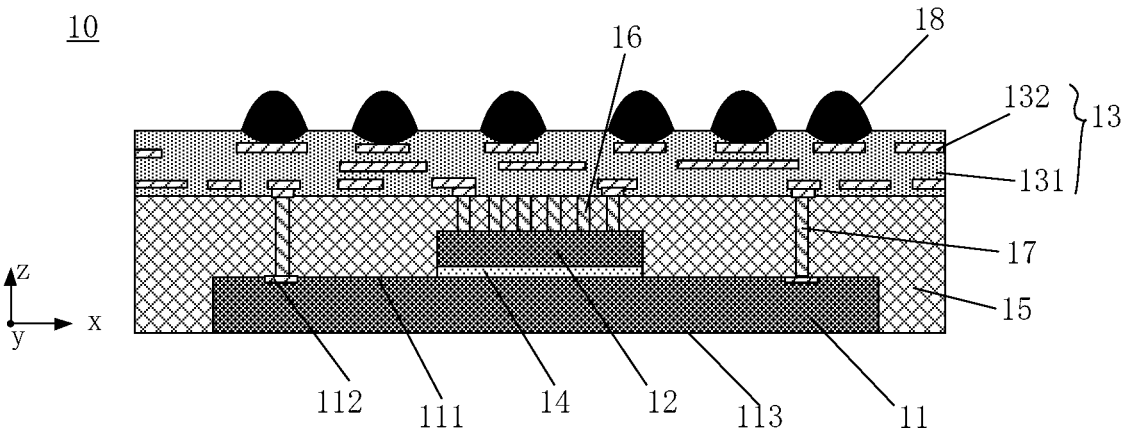
Figure 1I:
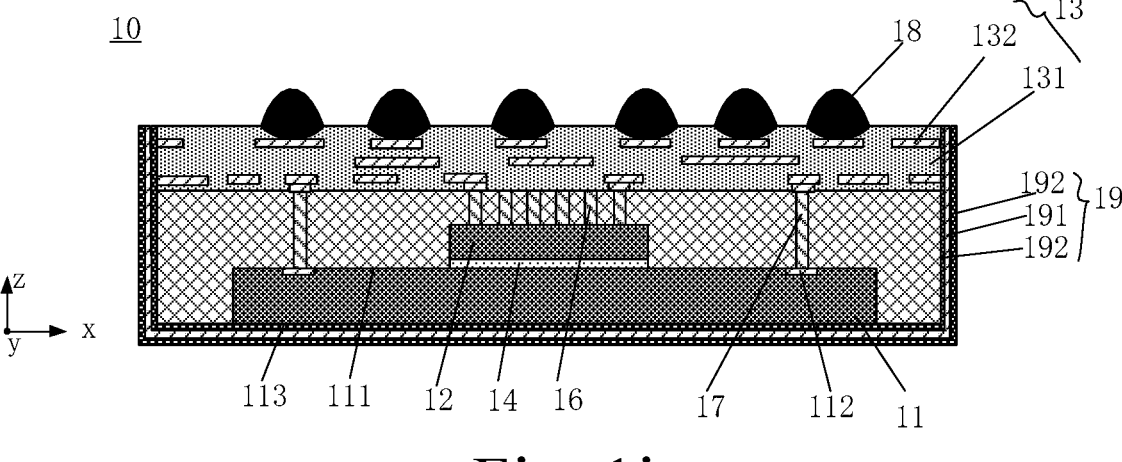
Figure 1G:
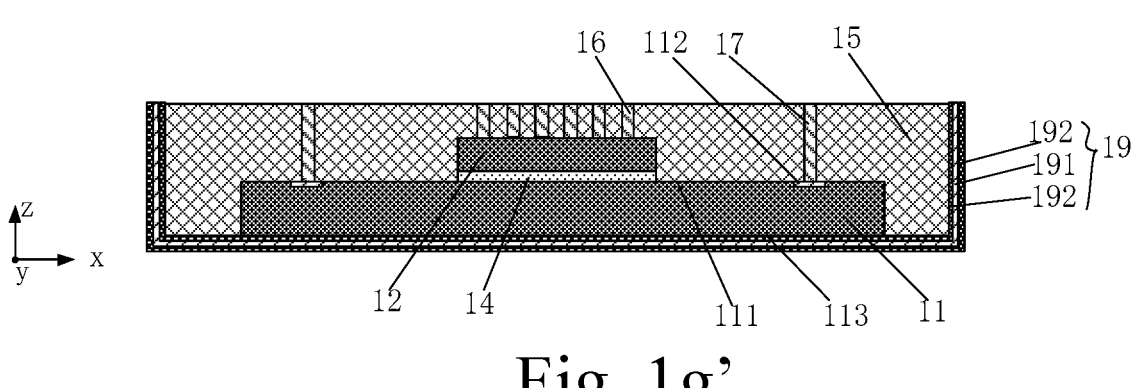
Figure 1H:
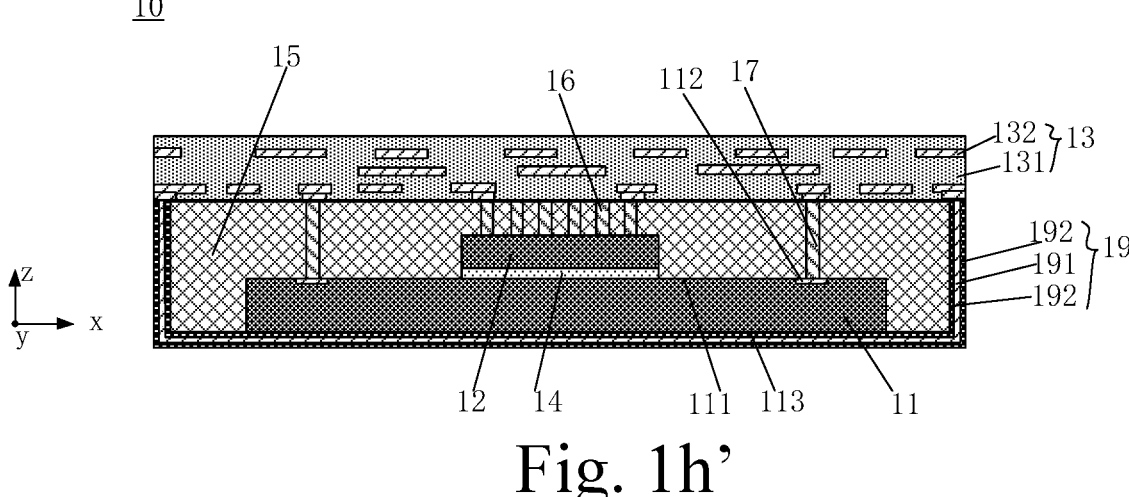
Figure 1I:
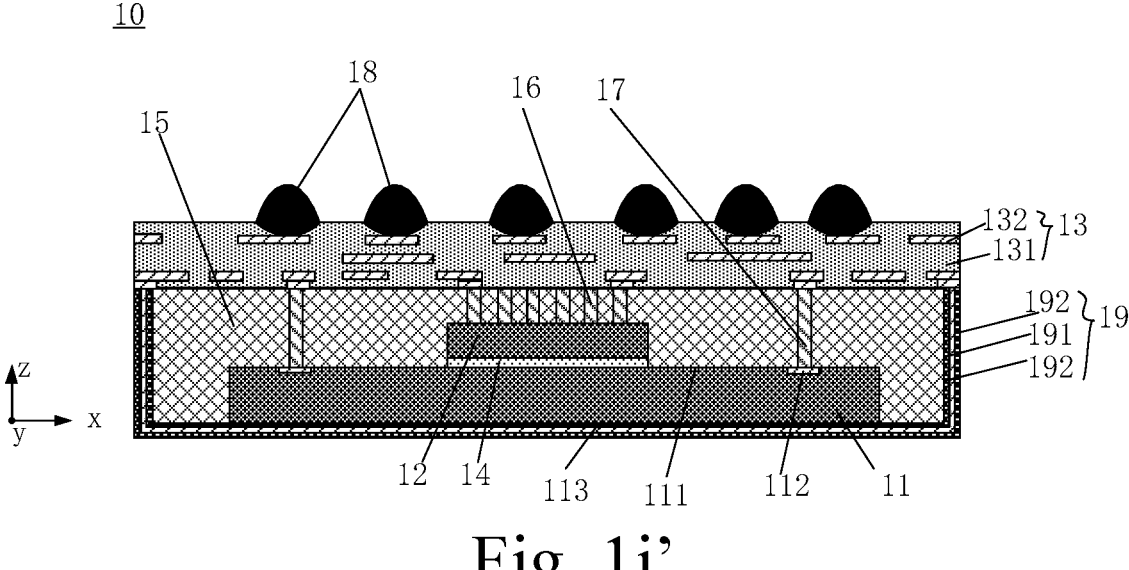

Refer to FIG. 1*i* and FIG. 1*i'*. FIG. 1*i* is a schematic cross-sectional view of an exemplary memory system package structure 10 provided by an implementation of the present disclosure. FIG. 1*i'* is another schematic cross-sectional view of the memory system package structure 10 provided by an implementation of the present disclosure. In some implementations, the memory system package structure 10 includes a memory chip 11, a memory controller 12 and a redistribution layer 13. In an implementation, the memory chip 11 includes a first surface 111, the memory controller 12 is positioned on the first surface 111, and the redistribution layer 13 is positioned on a side of the memory controller 12 facing away from the memory chip 11. The memory chip 11 and the memory controller 12 can be electrically connected with the redistribution layer 13.

In an implementation, extension directions of the first surface 111 may be referred to as an x direction and a y direction, and a direction perpendicular to the first surface 111 may be referred to as a z direction, which can be regarded as a stacking direction of the memory chip 11 and the memory controller 12. The stacking direction z, the extension direction x and the extension direction y of the first surface 111 are perpendicular to each other.

It is readily to be understood that since both the memory chip 11 and the memory controller 12 are electrically connected with the redistribution layer 13, the memory chip 11 and the memory controller 12 can be electrically connected with each other via the redistribution layer 13, thereby realizing the control of the memory chip 11 by the memory controller 12.

In some implementations, the redistribution layer 13 may include an insulating layer 131 and a conductive layer 132 formed in the insulating layer 131. For example, the insulating layer 131 can be mainly made of material including polymer film materials, such as Polyimide (PI), Benzocyclobutene (BCB) and the like, and may also include other suitable insulating materials, such as silicon oxide, silicon nitride, etc. The conductive layer 132 may be made of material including at least one metal material such as gold, copper, aluminum, copper alloy, aluminum alloy, etc.

The redistribution layer (RDL) 13 is formed by depositing a metal material and an insulating material on the surface of a wafer and forming a corresponding metal wiring pattern, so as to rearrange signal input/output (I/O) ports of the chips (the memory chip 11 and the memory controller 12) to a new region allowing for loose occupation. The memory system package structure 10 may be a fan-out package, that is, I/O ports are arranged beyond the coverage of a die area, thus providing more I/O ports; or a fan-in package, that is, I/O ports are arranged within the coverage of the die area, which is not limited here.

In some implementations, the memory controller 12 and the first surface 111 of the memory chip 11 may be fixed by adhesive. For example, the memory system package structure 10 may further include an adhesive layer 14, which is positioned between the first surface 111 and the memory controller 12 and is used for fixing the memory controller 12 and the memory chip 11. The adhesive layer 14 may include a die attach film (DAF).

In some implementations, the memory chip 11 may include a plurality of memory dies stacked in sequence along the z direction, and the memory dies may be fixed by DAF, so as to increase the chip integration while avoiding an increase in a package area on an xy plane as much as possible.

In some implementations, the memory chip 11 may further include a plastic packaging layer 15. The plastic packaging layer 15 is positioned on a side of the memory controller 12 facing away from the memory chip 11 and covers the sides of the memory controller 12, the sides of the memory chip 11 and the first surface 111 in a direction towards the first surface 111. In an implementation, the redistribution layer 13 is positioned on a side of the plastic packaging layer 15 facing away from the first surface 111.

In some implementations, the material of the plastic packaging layer 15 may include epoxy molding compound (EMC). For example, the plastic packaging layer 15 can be mainly used to integrate the memory controller 12 and the memory chip 11 into one package to realize a substantially complete function, that is, to realize a system in package (SIP).

In some implementations, an exposed conductive pad 112 is disposed in the first surface 111. The memory system package structure 10 may further include:

a first conductive structure 16 positioned on the side of the memory controller 12 facing away from the memory chip 11 and electrically connected with the memory controller 12; and a second conductive structure 17 positioned on the first surface 111 and electrically connected with the conductive pad 112, wherein both the first conductive structure 16 and the second conductive structure 17 penetrate through the plastic packaging layer 15 in the direction perpendicular to the first surface 111, extend to the redistribution layer 13, and are electrically connected with the redistribution layer 13.

In some implementations, both the first conductive structure 16 and the second conductive structure 17 can be made of a conductive material, which may include at least one metal material such as gold, copper, aluminum, copper alloy, aluminum alloy, etc. The first conductive structure 16 and the second conductive structure 17 may have the same or different conductive materials.

The first conductive structure 16 and the second conductive structure 17 may be conductive pillars which are conductive with the redistribution layer 13 in the stacking direction z, so that the memory controller 12 and the memory chip 11 are vertically conductive with each other, which shortens the conduction distance between the memory controller 12 and the memory chip 11, speeds up signal transmission, and to some extent improves the overall high frequency performance of the memory system package structure 10. Since the memory controller 12 and the memory chip 11 are not directly conductive with each other and no bonding layer is thus disposed between the memory controller 12 and the memory chip 11 to realize electrical connection therebetween, it is unnecessary to consider a mold clearance, and thus a minimum thickness allowed for the structure can be achieved in the stacking direction z.

In other implementations, referring to FIG. 2, which is a schematic cross-sectional view of another exemplary memory system package structure 20 provided by an implementation of the present disclosure, the memory system package structure 20 includes a substrate 21, and a memory chip 22 and a memory controller 23 that are positioned on the substrate 21 and spaced apart. A circuit layer is disposed in the substrate 21, and both the memory chip 22 and the memory controller 23 are electrically connected with the circuit layer through leads 24.

It is readily to be understood that, for such a memory system package structure 20, on the one hand, since the memory chip 22 and the memory controller 23 are disposed side-by-side and spaced apart on the substrate 21, in view of the size of the memory chip 22 itself, a package area (mainly the area on the xy plane) of the memory system package structure 20 needs to additionally consider a spacing distance and the size of the memory controller 23, leading to a significant increase in the package area, which is not conducive to the development of a small-sized package structure. On the other hand, since the substrate 21 needs to be provided and the substrate 21 requires circuit layer design and processing, such as wire bonding, the cost of the package structure is relatively high, and the flow of the packaging process is relatively complicated.

In contrast, the memory system package structure 10 in the implementations of the present disclosure does not need to be provided with a substrate, which saves the substrate cost and reduces the package cost. In addition, since the memory controller 12 is stacked on the memory chip 11, it is possible to achieve a package of substantially an original size (mainly the size in the xy plane) with respect to the size of the memory chip 11 itself. That is, there is no obvious increase in the package area of the memory system package structure 10, thereby facilitating the miniaturization of the package structure.

In some implementations, with continuous reference to FIGS. 1i and 1i', the memory system package structure 10 may further include metal solder balls 18 positioned on a side of the redistribution layer 13 facing away from the memory controller 12 and electrically connected with the redistribution layer 13. The memory chip 11 and the memory controller 12 are electrically connected with the metal solder balls 18 through the redistribution layer 13.

In an implementation, the conductive layer 132 in the redistribution layer 13 is electrically connected with the metal solder balls 18, so that the metal solder balls 18, the first conductive structure 16 and the second conductive structure 17 can be electrically connected with one another through the redistribution layer 13. The metal solder balls 18 can include metal bumps, which may include Sn solder balls. The metal solder balls 18 function as I/O ports. Through the metal solder balls 18, signals from external devices can be input into the memory system package structure 10, and/or signals from the memory system package structure 10 can be output to external devices, thereby realizing communication between the external devices and the memory system package structure 10 (i.e., the memory chip 11 and the memory controller 12).

In some implementations, with continuous reference to FIGS. 1i and 1i', the memory system package structure 10 may further include an electromagnetic shielding layer 19, and the memory chip further includes a second surface 113 disposed opposite to the first surface 111. The electromagnetic shielding layer is positioned on the second surface 113 (that is, on the side of the memory chip 11 facing away from the first surface 111) and covers at least the sides of the plastic packaging layer 15 in the direction towards the first surface 111.

In an implementation, the plastic packaging layer 15 and the electromagnetic shielding layer 19 enclose the memory chip 11 and the memory controller 12, so as to avoid external influences on the memory chip 11 and the memory controller 12, such as external physical damage and/or chemical damage (such as oxidation). Generally, the electromagnetic shielding layer 19 needs to be electrically connected with the conductive layer 132 in the redistribution layer 13, to jointly form a metal closed space in which the memory chip 11 and the memory controller 12 are positioned, thus achieving the purpose of electromagnetic shielding.

The electromagnetic shielding layer 19 may be made of material including a metal and/or metal alloy material, such as one or several metal materials such as gold, silver, copper and aluminum, or a metal alloy material synthesized from several metal materials. In an implementation, the electromagnetic shielding layer 19 may include a metal layer 191 and metal compound layers 192 on both sides of the metal layer 191. For example, the metal layer 191 may include copper, the metal compound layers 192 may include stainless steel, and the metal compound layers 192 may allow the metal layer 191 to be better fitted over the second surface 113.

In some implementations, the electromagnetic shielding layer 19 may, starting from the second surface 113, cover the sides of the plastic packaging layer 15 in the direction towards the first surface 111, for example, as shown FIG. 1i'. In this case, the redistribution layer 13 can be positioned on the electromagnetic shielding layer 19 and the plastic packaging layer 15, and the top of the electromagnetic shielding layer 19 can be electrically connected with the conductive layer 132 in the redistribution layer 13. The electromagnetic shielding layer 19 may also, starting from the second surface 113, cover the sides of the plastic packaging layer 15 and the sides of the redistribution layer 13 in the direction towards the first surface 111, for example, as shown in FIG. 1i. In this case, the electromagnetic shielding layer 19 can be electrically connected with the conductive layer 132 in the redistribution layer 13 from the sides of the redistribution layer 13.

It should be noted that since the second surface 113 of the memory chip 11 is in direct contact with the electromagnetic shielding layer 19, the first surface 111 is electrically connected with the conductive layer 132 through the first conductive structure 16, and the memory controller 12 (a main heat source) is electrically connected with the conductive layer 132 through the second conductive structure 17, the conductive layer 132 can be electrically connected with the metal solder balls 18, so that the heat generated by the memory chip 11 and the memory controller 12 can be diffused to the outside through the electromagnetic shielding layer 19 and the metal solder balls 18, thereby greatly improving the heat dissipation capability.

It should be noted that the memory system package structure 10 of the above examples can be used to form various memory system products, for example, a Universal Flash Memory (UFS), an embedded Multimedia Card (eMMC), a PC card (PCMCIA, Personal Computer Memory Card International Association), a CF card, a Smart Media (SM) card, a memory stick, a Multimedia Card (MMC, RS-MMC, MMCmicro), a SD card (SD, miniSD, microSD, SDHC), an SSD, etc.

The memory controller 12 in the memory system package structure 10 may be configured to control operations of the memory dies in the memory chip 11, such as read operations, erase operations and programing operations. The memory controller 12 may also be configured to manage various functions related to data stored or to be stored in the memory dies, including but not limited to, bad block management, garbage collection, wear leveling, etc. Any other suitable functions may also be performed by the memory controller 12, such as formatting the memory dies. The memory controller 12 may communicate with an external device (for example, a host) according to a specific communication protocol. For example, the memory controller 12 may communicate with the external device through at least one of various interface protocols, such as a USB protocol, a Multimedia Card (MMC) protocol, a Peripheral Component Interconnect (PCI) protocol, a Serial Bus (PCI-E) protocol, an Advanced Technology Attachment (ATA) protocol, a Serial-ATA protocol, a Parallel-ATA20 protocol, a Small Computer Small Interface (SCSI) protocol, an Enhanced Small Disk Interface (ESDI) protocol, an Integrated Drive Electronics (IDE) protocol, etc.

Based on the memory system package structure 10 provided by the above implementations, an implementation of the present disclosure further provides a manufacturing method of the memory system package structure 10.

Refer to FIGS. 1a to 1i, 1g' to 1i' and FIG. 3. FIGS. 1a to 1i are schematic cross-sectional views of an exemplary memory system package structure 10 in different process steps. FIGS. 1g' to 1i' are another set of schematic cross-sectional views of the memory system package structure 10 in different process steps. FIG. 3 is a flowchart of an exemplary manufacturing method of the memory system package structure 10 provided by an implementation of the present disclosure. The manufacturing method of the memory system package structure 10 includes the following steps S101 to S104.

At step S101, a memory chip 11 is provided. In an implementation, the memory chip 11 can include a first surface 111 and a second surface 113 that are oppositely disposed. In an implementation, the second surface 113 can be stacked on a carrier M1.

In an implementation, referring to FIG. 1a, the carrier M1 is mainly used as a carrier wafer for various chips in the packaging process, temporary bonding film M2 may also be disposed on the carrier M1, and the second surface 113 of the memory chip 11 adheres to the temporary bonding film M2.

In some implementations, the memory chip 11 may include a plurality of memory dies stacked sequentially along the z direction, and memory dies and memory dies may be adhered and fixed by DAF.

At step S102, the memory controller 12 is stacked on the first surface 111.

In an embodiment, referring to FIG. 1b, the memory controller 12 and the first surface 111 of the memory chip 11 may be fixed through adhering. For example, an adhesive layer 14 may be formed on the first surface 111 prior to staking the memory controller 12 in the z direction, and then the memory controller 12 may be adhered to the adhesive layer 14. The adhesive layer 14 may include the above DAF.

In some implementations, an exposed conductive pad 112 can be disposed in the first surface 111. After step S102, the manufacturing method of the memory system package structure 10 may further include:

forming a first conductive structure 16 and a second conductive structure 17, the first conductive structure 16 being positioned on a side of the memory controller 12 facing away from the memory chip 11 and electrically connected with the memory controller 12, the second conductive structure 17 being positioned on the first surface 111 and electrically connected with the conductive pad 112; and forming a plastic packaging layer 15 on the side of the memory controller 12 facing away from the memory chip 11, the plastic packaging layer 15 covering at least the first conductive structure 16, the second conductive structure 17, the sides of the memory controller 12, the sides of the memory chip 11 and the first surface 111 in a direction towards the first surface 111.

In an implementation, referring to FIGS. 1c and 1d, both the first conductive structure 16 and the second conductive structure 17 are made of a conductive material, which may include at least one metal material such as gold, copper, aluminum, copper alloy, aluminum alloy, etc. The first conductive structure 16 and the second conductive structure 17 may have the same or different conductive materials. The first conductive structure 16 and the second conductive structure 17 may be conductive pillars which are conductive with a redistribution layer 13 in a stacking direction z. The conductive pillars may be formed by an electroplating process, such as electroplating copper to form the first conductive structure 16 and the second conductive structure 17.

The material of the plastic packaging layer 15 may include epoxy molding compound. The plastic packaging layer 15 wraps the memory chip 11 and the memory controller 12, except for the second surface 113. The plastic packaging layer 15 is mainly used to integrate the memory controller 12 and the memory chip 11 into one package, to realize a substantially complete function, that is, to realize a system in package.

At step S103, the carrier M1 is removed, and the second surface 113 is exposed.

In an implementation, referring to FIGS. 1d and 1e, the carrier M1 and the temporary bonding film M2 may be removed from the second surface 113 after the plastic packaging layer 15 is formed.

At step S104, a redistribution layer 13 is formed on the side of the memory controller 12 facing away from the memory chip 11, the memory chip 11 and the memory controller 12 being electrically connected with the redistribution layer 13.

In an implementation, referring to FIG. 1g or FIG. 1h', the redistribution layer 13 may include an insulating layer 131 and a conductive layer 132 formed in the insulating layer 131. In some implementations, the insulating layer 131 is mainly made of material including polymer film materials, such as polyimide, benzocyclobutene and the like, and may also include other suitable insulating materials, such as silicon oxide, silicon nitride, etc. The conductive layer 132 may be made of material comprising at least one metal material such as gold, copper, aluminum, copper alloy, aluminum alloy, etc.

In some implementations, before the redistribution layer 13 is formed, the manufacturing method of the memory system package structure 10 may further include:

removing a part of the plastic packaging layer 15 from a side of the plastic packaging layer 15 facing away from the first surface 111, and exposing the first conductive structure 16 and the second conductive structure 17, forming a redistribution layer 13 on the side of the memory controller 12 facing away from the memory chip 11 including forming the redistribution layer 13 on the side of the plastic packaging layer 15 facing away from the first surface 111, the redistribution layer 13 being electrically connected with the exposed first conductive structure 16 and the exposed second conductive structure 17.

In an implementation, the redistribution layer 13 can be obtained by depositing a metal material and an insulating material on the surface of a wafer and forming a corresponding metal wiring pattern. Part of the plastic packaging layer 15 may be removed by wafer grinding, to expose end faces of the first conductive structure 16 and the second conductive structure 17 that were completely wrapped before, such that when the redistribution layer 13 is formed, the conductive layer 132 in the redistribution layer 13 may be directly and electrically connected with the exposed end faces of the first conductive structure 16 and the second conductive structure 17.

In some implementations, after the redistribution layer 13 is formed, the manufacturing method of the memory system package structure 10 may further include:

forming metal solder balls 18 on a side of the redistribution layer 13 facing away from the memory controller 12, the metal solder balls 18 being electrically connected with the redistribution layer 13, the memory chip 11 and the memory controller 12 being electrically connected with the metal solder balls 18 through the redistribution layer 13.

In an implementation, the conductive layer 132 in the redistribution layer 13 can be electrically connected with the metal solder balls 18, so that the metal solder balls 18, the first conductive structure 16 and the second conductive structure 17 can be electrically connected with one another through the redistribution layer 13. The metal solder balls 18 can include metal bumps, which may include Sn solder balls. The metal solder balls 18 function as I/O ports. Through the metal solder balls 18, signals from external devices can be input into the memory system package structure 10, and/or signals from the memory system package structure 10 can be output to external devices, thereby realizing communication between the external devices and the memory system package structure 10 (i.e., the memory chip 11 and the memory controller 12).

In some implementations, before or after the redistribution layer 13 is formed, an electromagnetic shielding layer 19 may also be formed, which may provide an electromagnetic shielding function, referring to FIGS. 1f to 1i (which show that the electromagnetic shielding layer 19 is formed after the redistribution layer 13 is formed), or referring to FIGS. 1f and 1g' to 1i' (which show that the electromagnetic shielding layer 19 is formed before the redistribution layer 13 is formed). The manufacturing method of the memory system package structure 10 may further include:

forming an electromagnetic shielding layer 19 on the exposed second surface 113, the electromagnetic shielding layer 19 covering at least the sides of the plastic packaging layer 15 in the direction towards the first surface 111.

In an implementation, the electromagnetic shielding layer 19 may be formed by sputtering, spraying, printing or vapor deposition, etc. The electromagnetic shielding layer 19 may include a metal layer 191 and metal compound layers 192 on both sides of the metal layer 191, and the metal compound layers 192 are positioned on the second surface. In an implementation, the metal layer 191 may include copper, the metal compound layer 192 may include stainless steel, and the metal compound layers 192 may allow the metal layer 191 to be better fitted over the second surface 113. In this case, the step of forming the electromagnetic shielding layer 19 can include sequentially forming a first metal compound layer 192, the metal layer 191 and a second metal compound layer 192 on the side of the memory controller 12 facing away from the memory chip 11.

It should be noted that, in some implementations, in a case where the electromagnetic shielding layer 19 is formed after the redistribution layer 13, the redistribution layer 13 and the metal solder balls 18 may be sequentially formed on the side of the plastic packaging layer 15 facing away from the first surface 111 after part of the plastic packaging layer 15 is removed to expose the first conductive structure 16 and the second conductive structure 17 (referring to FIGS. 1f to 1h), and then the electromagnetic shielding layer 19 is formed on the second surface 113 of the memory chip 11 by sputtering, spraying, printing or vapor deposition (referring to FIGS. 1h to 1i). In this case, the electromagnetic shielding layer 19 covers the sides of the plastic packaging layer 15 and the sides of the redistribution layer 13, and is electrically connected with the conductive layer 132 in the redistribution layer 13 from the sides of the redistribution layer 13.

In some implementations, in a case where the electromagnetic shielding layer 19 is formed before the redistribution layer 13, the electromagnetic shielding layer 19 may be first formed on the second surface 113 after removing part of the plastic packaging layer 15 to expose the first conductive structure 16 and the second conductive structure 17, in which case the electromagnetic shielding layer 19 covers the sides of the plastic packaging layer 15 (referring to FIGS. 1f and 1g'), and then the redistribution layer 13 and the metal solder balls 18 are sequentially formed at the side of the plastic packaging layer 15 facing away from the first surface 111 (referring to FIGS. 1g' to 1i'). The top of the electromagnetic shielding layer 19 is electrically connected with the conductive layer 132 in the redistribution layer 13.

As can be seen from the above, according to the memory system package structure 10 and the manufacturing method thereof provided by the implementations of the present disclosure, by stacking the memory controller 12 on the first surface 111 of the memory chip 11 and disposing the redistribution layer 13 on the side of the memory controller 12 facing away from the memory chip 11, the memory chip 11 and the memory controller 12 are electrically connected with the redistribution layer 13 respectively, so that a substrate is not required to be provided, thereby saving the substrate cost and reducing the packaging cost. Moreover, since the memory controller 12 is stacked on the memory chip 11, it is possible to achieve a package of substantially an original size, thereby facilitating the miniaturization of the package structure.

The above are merely preferred implementations of the present disclosure, and are not intended to limit the present disclosure. Any modification, equivalent substitution and improvement made within the spirit and principle of the present disclosure should be included in the scope of protection of the present disclosure.

What is claimed is:

1. A memory system package structure, comprising:
a memory chip including a first surface and a second surface opposite to the first surface;
an electromagnetic shielding layer positioned on the second surface of the memory chip;
a memory controller positioned on the first surface; and
a redistribution layer positioned on a side of the memory controller facing away from the memory chip, the memory chip and the memory controller being electrically connected with the redistribution layer,
wherein the memory chip further includes a plastic packaging layer that is positioned on the side of the memory controller facing away from the memory chip and covers sides of the memory controller, sides of the memory chip and the first surface of the memory chip in a direction towards the first surface of the memory chip, the redistribution layer is positioned on a side of the plastic packaging layer facing away from the first surface of the memory chip, and the electromagnetic shielding layer covers at least sides of the plastic packaging layer in the direction towards the first surface of the memory chip.

2. The memory system package structure of claim 1, wherein a top of the electromagnetic shielding layer is electrically connected with the redistribution layer.

3. The memory system package structure of claim 1, wherein the electromagnetic shielding layer further covers sides of the redistribution layer.

4. The memory system package structure of claim 3, wherein the electromagnetic shielding layer is electrically connected with the redistribution layer from the sides of the redistribution layer.

5. The memory system package structure of claim 1, wherein the electromagnetic shielding layer includes a metal layer and metal compound layers disposed on both sides of the metal layer.

6. The memory system package structure of claim 1, further comprising:

an exposed conductive pad disposed on the first surface of the memory chip;

a first conductive structure positioned on the side of the memory controller facing away from the memory chip and electrically connected with the memory controller; and a second conductive structure positioned on the first surface and electrically connected with the conductive pad, wherein both the first conductive structure and the second conductive structure penetrate the plastic packaging layer in a direction perpendicular to the first surface, extend to the redistribution layer, and are electrically connected with the redistribution layer.

7. The memory system package structure of claim 6, further comprising metal solder balls positioned on a side of the redistribution layer facing away from the memory controller and electrically connected with the redistribution layer, wherein the memory chip and the memory controller are electrically connected with the metal solder balls through the redistribution layer.

8. The memory system package structure of claim 7, wherein the redistribution layer includes an insulating layer and a conductive layer formed in the insulating layer, and the conductive layer is electrically connected with the first conductive structure, the second conductive structure and the metal solder balls.

9. The memory system package structure of claim 1, further comprising an adhesive layer that is positioned between the first surface and the memory controller and is used for fixing the memory controller and the memory chip.

10. The memory system package structure of claim 1, wherein the memory chip and the memory controller are indirectly conductive to each other via the redistribution layer.

11. The memory system package structure of claim 8, wherein the electromagnetic shielding layer is electrically connected to the conductive layer.

12. The memory system package structure of claim 1, wherein the electromagnetic shielding layer includes a metal layer and metal compound layers that are formed on both sides of the metal layer.

13. The memory system package structure of claim 12, wherein the metal layer includes copper.

14. The memory system package structure of claim 12, wherein the metal compound layers include stainless steel.

15. The memory system package structure of claim 6, wherein the first conductive structure is disposed between the memory controller and the redistribution.

* * * * *